(12) United States Patent
König et al.

(10) Patent No.: US 6,317,406 B1
(45) Date of Patent: Nov. 13, 2001

(54) DEVICE FOR GRIPPING AND HOLDING A FLAT SUBSTRATE

(75) Inventors: Michael König, Frankfurt am Main; Johannes Beul, Rehe; Stefan Bangert, Steinau, all of (DE)

(73) Assignee: Unaxis Deutschland Holding AG, Hanau (DE)

( * ) Notice: Subject to any disclaimer, the term of this patent is extended or adjusted under 35 U.S.C. 154(b) by 0 days.

(21) Appl. No.: 09/285,105

(22) Filed: Apr. 2, 1999

(30) Foreign Application Priority Data

Apr. 2, 1998 (DE) ............................... 198 14 834

(51) Int. Cl.[7] .................................................. B25J 15/08
(52) U.S. Cl. ............................................ 369/270; 118/500
(58) Field of Search ................................ 369/270, 271, 369/264; 360/99.12; 414/226; 118/502, 503, 500

(56) References Cited

U.S. PATENT DOCUMENTS

| | | | |
|---|---|---|---|
| 5,669,652 | * | 9/1997 | Reising et al. .......................... 294/88 |
| 5,803,521 | * | 9/1998 | Zejda et al. .............................. 294/97 |
| 5,879,121 | * | 3/1999 | Kempf ................................... 414/226 |
| 5,913,653 | * | 6/1999 | Kempf ................................... 118/500 |
| 5,989,342 | * | 11/1999 | Ikeda et al. ............................. 118/52 |
| 6,054,029 | * | 4/2000 | Kempf et al. ..................... 204/298.25 |

* cited by examiner

Primary Examiner—David L. Ometz
Assistant Examiner—Franklin D. Altman, III
(74) Attorney, Agent, or Firm—Smith, Gambrell & Russell, LLP

(57) ABSTRACT

A device for gripping and holding a compact disc comprising a housing, a plurality of grippers that are arranged in said housing, each of said grippers being provided with a magnet, said gripper being guided in recesses in the housing which allow a movement of each gripper transverse to a vertical axis of said housing and cooperating with an electromagnet. The magnetic field axis of which coincides with the vertical axis (H) of the housing (3) and which moves the grippers (5, . . . ) back and forward between two limit stops (a, b) depending on the polarity of the electromagnet (16). The housing (3) is encompassed with play by a holder (10), wherein elements (13, . . . ) of an elastic material are provided between the holder (10) and the housing (3), namely in the part (9) of the housing (3) that is encompassed by the holder (10). The grippers (5, . . . ) respectively contain two limbs (5a, 5b, . . . ), one of which (5a, . . . ) extends downward perpendicular to the first limb (5b, . . . ) and encompasses the edge of the central opening (15) of the substrate (14) with its end.

7 Claims, 2 Drawing Sheets

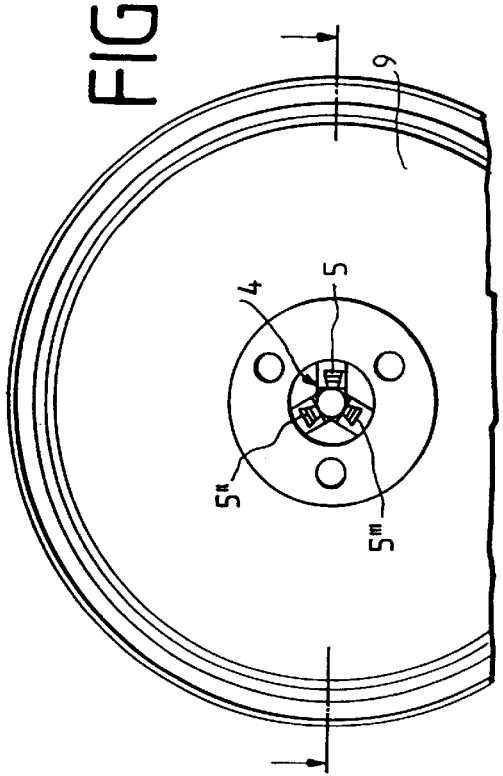

DEVICE FOR GRIPPING AND HOLDING A FLAT SUBSTRATE

INTRODUCTION AND BACKGROUND

The present invention pertains to a device for gripping and holding a flat, preferably circular, disc-shaped substrate with a central opening, e.g., a compact disc. More particularly, the present invention relates to a device which comprises several grippers that are arranged in a housing, wherein the grippers are held and guided in recesses of the housing which allow a movement of the grippers transverse to the vertical axis of the housing. Magnets that cooperate with an electromagnet which is centrally arranged in the housing above the magnets are rigidly arranged on the ends of the respective grippers. The magnetic field axis of the electromagnet coincides with the vertical axis of the housing, and the electromagnet moves the grippers provided with magnets back and forth between two limiting stops depending on the polarity of the electromagnet.

The coating of circular substrates, e.g., glass or aluminum discs that serve as magnetic or magneto-optical data carriers, is known in the art from vacuum processing technology—in particular, thin-layer technology. These disc-shaped substrates are utilized as storage media for digital information. For example, embossed plastic discs are coated with an aluminum layer by means of a sputtering process. The sputtering systems used for this purpose usually contain an automated handling device for transporting the substrates in front, into and behind a vacuum chamber.

For example, a swivel arm of the handling system transports the substrates into the vacuum chamber from a cushion. In a typical chamber, the substrates are placed onto a rotary table, whereafter the substrates are transported to the individual stations of the vacuum chamber on this rotary table. Various devices for gripping and holding the substrates, i.e., for loading and unloading the rotary table, are known from the state of the art.

Until now, grippers that are actuated from outside the chamber by means of a linear motion leadthrough were most frequently utilized in vacuum chambers.

These known devices have the disadvantages that they usually contain an excessively high number of moving parts and that undesirable particles are produced due to the sliding motions in the linear motion leadthroughs. These particles are subsequently transported into the coating chamber and disadvantageously influence the result of the coating process. In addition, wear of the seals in such linear motion leadthroughs usually occurs after a certain time of operation. These worn seals always result in a leak in the vacuum chamber, i.e., time-consuming and expensive repairs need to be carried out.

A device for gripping and holding a flat, preferably disc-shaped substrate has already been proposed (G 93 07263.5). This device essentially consists of several finger-shaped grippers and a membrane of an elastic material which seals an opening arranged in a pressure-tight housing, wherein different pressures can be adjusted on the front side and the rear side of the membrane. The membrane is arranged in such a way that it carries out an excursion from its idle position if a differential pressure exists and returns into its idle position under the influence of a compression spring if the pressure on the front side and the rear side of the membrane is identical, and wherein one respective end of the grippers is mechanically connected to the membrane in such a way that their upper free ends carry out a swiveling motion that is proportional to the excursion of the membrane in order to grip and hold or release the substrate.

A device for gripping and holding a compact disc is also known (DE 195 29 945C2). This device consists of several finger-shaped grippers that are arranged in a housing in tiltable fashion, wherein the grippers are held and guided in openings in the top part of the housing which allow a tilting motion of the grippers about axes that extend transverse to the longitudinal axis of the housing. The tilting axes of all grippers extend in one plane and collectively form a polygon that encompasses the longitudinal axis. Magnets are rigidly arranged on the respective ends of the grippers which face away from the substrate, and the magnets cooperate with an electromagnet that is arranged in the housing above the gripper magnets. The magnetic field axis of the electromagnet coincides with the longitudinal axis of the housing. The electromagnet moves the gripper ends provided with magnets back and forward between two limit stops depending on the polarity of the electromagnet.

It is therefore an object of the present invention to make it possible to grip and hold substrates inside and outside of vacuum chambers in an extremely fast and particularly reliable fashion.

A further object of the present invention is to be able to compensate for slight irregularities and inaccuracies in the supply of the substrates so as to prevent damage to the sensitive substrates.

SUMMARY OF THE INVENTION

The above and other objects of the invention can be achieved by a device having a housing that is at least partially encompassed by a carrier with a central opening, wherein elements of an elastic material are distributed between the carrier and the housing, namely in the part of the housing which is encompassed by the carrier to provide play. Each of the elastic elements rests in a depression formed one half in the housing and the other half in a depression in the carrier situated opposite to the depression with the housing.

A feature of the invention are recesses for the grippers that extend in a plane that extends transverse to the vertical housing axis and radially outward, wherein the grippers respectively contain two limbs, one of which is held in the recess and guided in displaceable fashion while forming a guide shoe, and the other one of which extends downward to the first limb and parallel to the vertical housing axis and is provided with a notch for encompassing the edge of the central opening of the substrate on its free end.

BRIEF DESCRIPTION OF THE DRAWINGS

The invention will be further understood with reference to the accompanying drawings, wherein:

FIG. 1 is a partial cross sectional view of a housing of the invention,

FIG. 2 is a partial bottom view of a housing according to the invention, and

DETAILED DESCRIPTION OF INVENTION

Figure 3:
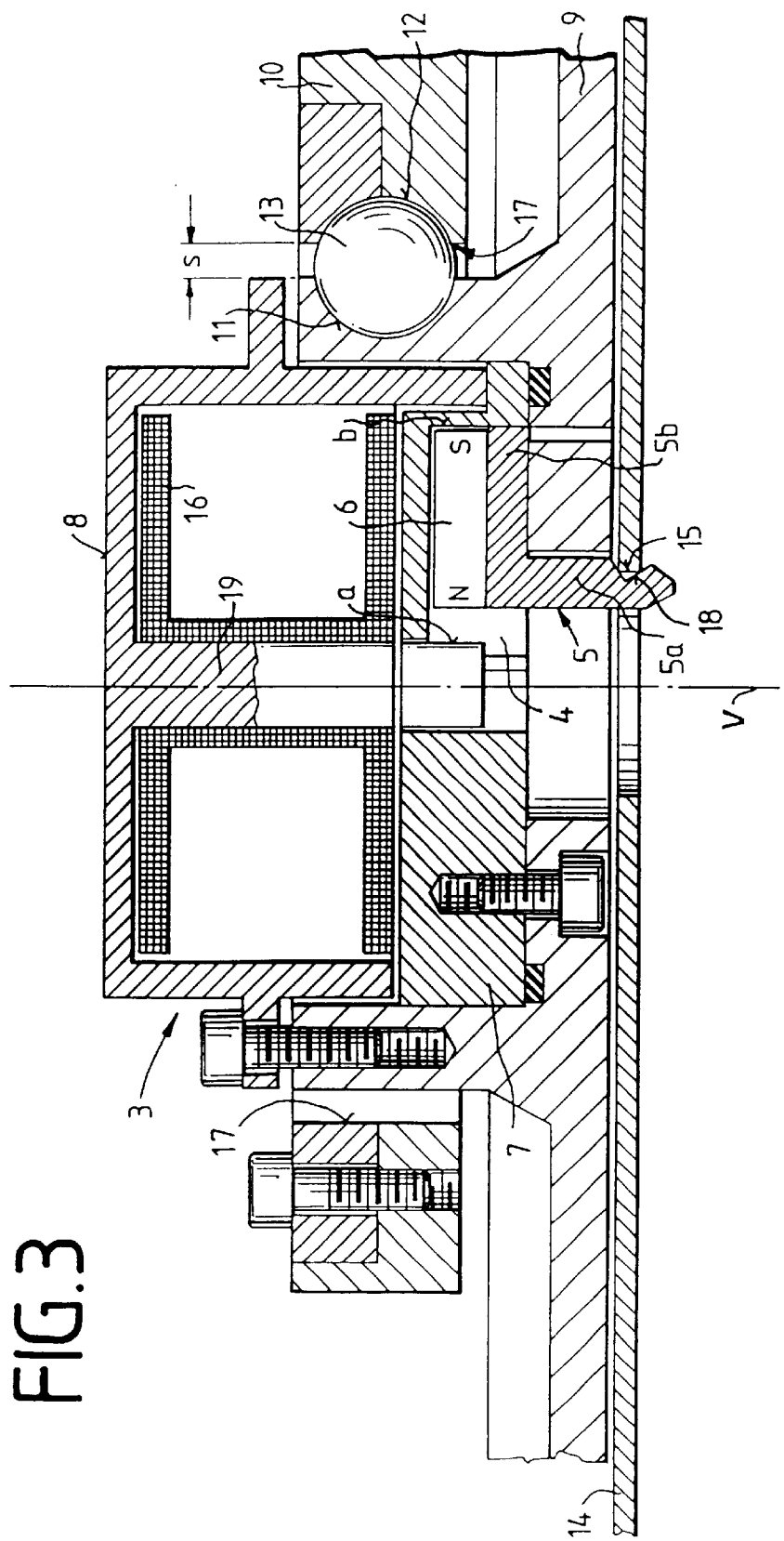
FIG. 3 is a partial cross section of the housing of the invention in greater detail.

The invention allows the realization of various embodiments; which are described below with reference to the embodiment schematically illustrated in the enclosed figures which show longitudinal sections and a bottom view of a device according to the invention with three radially displaceable grippers.

As shown in FIG. 1, the device essentially consists of a flange-shaped housing 3 with a central blind hole bore, into which a circular, disc-shaped guide part 7 is inserted. Three radially extending grooves or recesses 4, 4', 41" are cut into this guide part.

Grippers 5, 5', 5" are arranged in the recesses 4, 4', 4" in displaceable fashion; in this case, each gripper 5, 5', 5" contains two limbs 5a, 5b (see FIG. 3), wherein one respective limb 5b is realized in the form of a guide shoe and provided with a magnet 6, . . . on its upper narrow side. The recesses 4, 4', 4" extend transverse to the vertical axis V of the housing 3, namely in the radial direction, wherein a total of three slot-shaped recesses 4, 4', 4" are provided at an angle of respectively 120 degrees in the embodiment shown in the figures.

It will be understood that there can be more than 3 grippers in the device according to the invention with accompanying recesses. The recesses 4, 4', 4" are machined into the circular, disc-shaped part 7 that is held in the flange 9 together with the pot-shaped housing part 8 which encompasses the magnet coil 16. In this case, the circular, disc-shaped part 7, the pot-shaped part 8 and the flange 9 form the housing 3 that is encompassed by a carrier 10, namely such that a certain play S exists between the carrier 10 and the flange 9. Dome-shaped depressions 11, . . . are provided between the flange 9 and the carrier 10, namely distributed over the circumference within the region of the opening 17. Corresponding dome-shaped depressions 12, . . . in the carrier 10 are situated opposite to the dome-shaped depressions 11. A ball-like element 13, . . . of elastic material is inserted into each pair of opposing depressions 11, 12 . . . , wherein all elements 13, . . . collectively fix the housing 3 on the carrier 10, namely in such a way that the housing 3 is able to carry out a slight swiveling or tilting motion relative to the carrier 10. A plurality of such elastic elements is present in the device of the invention.

A magnet coil 16 is arranged in the pot-shaped part 8 of the housing 3 which forms a magnet yoke and pushed onto the vertically extending pin 19. The pin 19 forms a limit stop "a" which the three grippers 5, 5', 5" adjoin when the device is situated in the release position.

In FIG. 3 which shows a section of the embodiment according to FIG. 1 on a larger scale, the grippers 5, 5' and 5" are situated in the clamping position, wherein the vertical limbs 5a, 5b. . . or their notches 18, . . . , respectively, encompass the edge of the central opening 15 of the substrate 14 or the CD, respectively, such that it is lifted by the carrier 10 of the transport device and can be transported. In the clamping position, the bar magnets 6, . . . which are respectively connected to the horizontally extending limbs 5b, . . . in rigid fashion adjoin the limit stop b.

FIG. 1 shows that the housing 3 and the flange 9 form a vacuum lock, i.e., the flange 9 serves for sealing the opening 20 in the wall 21 of the vacuum chamber and opening the opening 20. The grippers 5, . . . are situated within the region of the vacuum in the sealed position, wherein the magnet coil 16 remains on the side of the atmosphere.

Further variations and modifications of the foregoing will be apparent to those skilled in the art and are intended to be encompassed by the claims appended hereto.

German priority application 198 14 834.8 is relied on and incorporated herein by reference.

We claim:

1. A device for gripping and holding a flat disc-shaped substrate having a central opening, comprising a housing, a plurality of grippers arranged in said housing, wherein each of said grippers is held and guided in a recess in said housing which allow a movement of the grippers transverse to a vertical axis of said housing, a plurality of magnets that cooperate with an electromagnet which is centrally arranged in said housing above said magnets, said magnets being rigidly arranged on the ends of the respective grippers, wherein said electromagnet has a magnetic field axis which coincides with a vertical axis of the housing, and wherein said electromagnet moves the grippers provided with magnets back and forward between two limit stops depending on the polarity of the electromagnet, wherein the housing is at least partially encompassed with play by a carrier with a central opening, wherein an element of an elastic material is distributed between the cattier and the housing, wherein said elastic element rests in a depression of the housing part with one half and in a depression in the carrier situated opposite thereto with its other respective half, wherein the recesses for the grippers extend in a plane that extends transverse to the vertical housing axis and radially outward, wherein the grippers respectively contain two limbs, a first limb is held in the recess and guided in displaceable fashion while forming a guide shoe, and a second limb extends downward perpendicular to the first limb and parallel to the vertical housing axis and is provided with a notch on an end thereof for encompassing the edge of the central opening of the substrate.

2. The device according to claim 1 wherein said element of an elastic material is distributed between said carrier and the part of the housing which is encompassed by the carrier.

3. A device for gripping and holding a flat disc-shaped substrate having a central opening, said device comprising a housing, a plurality of grippers arranged in said housing, wherein said grippers are held and guided in recesses of the housing which allow a movement of the grippers transverse to a vertical axis of the housing, a plurality of magnets that cooperate with an electromagnet which is centrally arranged in said housing above said magnets, said magnets being rigidly arranged on the ends of respective grippers, wherein the magnetic field axis of the electromagnet coincides with the vertical axis of the housing, and wherein said electromagnet moves the grippers provided with magnets back and forward between two limit stops depending on the polarity of the electromagnet, said housing being at least partially encompassed with play by a carrier with a central opening, wherein an element of an elastic material is distributed between said carrier and the housing, wherein said elastic element rests in a depression of the housing part with one half and in a depression in the carrier situated opposite thereto with their other respective half.

4. A device for gripping and holding a flat disc-shaped substrate having a central opening, said device comprising a housing, a plurality of grippers arranged in said housing, wherein said grippers are held and guided in recesses of the housing which allow a movement of the grippers transverse to a vertical axis of said housing, a plurality of magnets that cooperate with an electromagnet which is centrally arranged in said housing above said magnets, said magnets being rigidly arranged on the ends of the respective grippers, wherein the magnetic field axis of the electromagnet coincides with the vertical axis of the housing, and wherein said electromagnet moves the grippers provided with magnets back and forward between two limit stops depending on the polarity of the electromagnet, said recesses for the grippers extending in a plane that extends transverse to the vertical housing axis and radially outward, wherein the grippers respectively contain two limbs, a first limb being held in the recess and guided in displaceable fashion while forming a guide shoe, and a second limb extending downward perpendicular to the first limb and parallel to the vertical housing axis and being provided with a notch for encompassing the edge of the central opening of the substrate.

5. A device for gripping and holding a flat substrate having a central opening comprising a plurality of grippers that are arranged in a housing, each of said grippers is held and guided in one of a plurality of recesses of the housing which allows movement of each of said grippers transverse to a vertical axis of the housing, a plurality of magnets that cooperate with an electromagnet centrally arranged in the housing above said magnets, each of said magnets being rigidly arranged on an end of a gripper, said electromagnet having a magnetic field axis, wherein said magnetic field axis of the electromagnet coincides with the vertical axis of the housing, and wherein said electromagnet moves each of said grippers back and forward between two limit stops, a carrier at least partially encompassing said housing, said carrier having a central opening, a plurality of elastic elements are distributed between the carrier and the housing so as to permit play between said housing and said carrier, wherein each of said elastic elements rests in a depression formed one half in housing and in a depression formed one half in the carrier, each of said depressions being in abutting relationship so as to form a space to accommodate said elastic element, wherein the recesses for the grippers extend in a plane that extends transverse to the vertical housing axis and radially outward, wherein the grippers respectively contain two limbs, one of which is held in the recess and guided in displaceable fashion while forming a guide shoe, and the other one of which extends downward perpendicular to the first limb and parallel to the vertical housing axis and is provided with a notch for encompassing the edge of the central opening of the substrate.

6. A device for gripping and holding a flat, circular, disc-shaped substrate having a central opening comprising a plurality of grippers that are arranged in a housing, wherein each of said grippers is held and guided in one of a plurality of recesses of the housing which allows movement of each of said grippers transverse to a vertical axis of the housing, a plurality of magnets that cooperate with an electromagnet centrally arranged in the housing above said magnets, each of said magnets being rigidly arranged on an end of a gripper, said electromagnet having a magnetic field axis, the magnetic field axis of the electromagnet coincides with the vertical axis of the housing, and wherein said electromagnet moves each of the grippers back and forward between two limit stops, a carrier at least partially encompassing said housing, said carrier having a central opening, a plurality of elastic elements distributed between the carrier and the housing so as to permit play between said housing and said carrier, wherein each of said elastic elements rests in a depression formed one half in said housing and in a depression formed one half in the carrier situated opposite to the depression in said housing so as to cooperate to position said elastic element.

7. A device for gripping and holding a flat, circular, disc-shaped substrate having a central opening comprising a plurality of grippers that are arranged in a housing, wherein each of said grippers is held and guided in one of a plurality of recesses of the housing which allows a movement of each of the grippers transverse to a vertical axis of the housing, a plurality of magnets that cooperate with an electromagnet centrally arranged in the housing above said magnets, each of said magnets being rigidly arranged to an end of a gripper, said electromagnet having a magnetic field axis, the magnetic field axis of the electromagnet coincides with the vertical axis of the housing, and wherein said electromagnet moves each of the grippers back and forward between two limit stops, each of the recesses for the grippers extending in a plane that extends transverse to the vertical housing axis and radially outward, wherein each of the grippers contains two limbs, a first limb held in a recess therefor and guided in displacement fashion while forming a guide shoe, and a second limb extending downward perpendicular to the first limb and parallel to the vertical housing axis and provided with a notch for encompassing an edge of the central opening of the substrate.

* * * * *